United States Patent [19]

Fazan et al.

[11] Patent Number: 5,100,825
[45] Date of Patent: Mar. 31, 1992

[54] METHOD OF MAKING STACKED SURROUNDING REINTRANT WALL CAPACITOR

[75] Inventors: Pierre C. Fazan; Howard E. Rhodes; Charles H. Dennison; Yauh-Ching Liu, all of Boise, Id.

[73] Assignee: Micron Technology, Inc., Boise, Id.

[21] Appl. No.: 614,892

[22] Filed: Nov. 16, 1990

[51] Int. Cl.⁵ .............................. H01L 21/70
[52] U.S. Cl. ........................ 437/52; 437/47; 437/48; 437/60; 437/228; 437/235; 437/919
[58] Field of Search ............... 437/47, 48, 51, 52, 437/60, 191, 193, 195, 225, 228, 233, 235, 919; 357/23.6, 51

[56] References Cited

U.S. PATENT DOCUMENTS 4,742,018 3/1988 Kimura et al. ............... 357/23.6

FOREIGN PATENT DOCUMENTS 0286269 12/1987 Japan .
0260454 10/1990 Japan .

OTHER PUBLICATIONS

"3-Dimensional Stacked Capacitor Cell for 16M and 64M DRAMS", IEDM, Dig. Tech., Papers, pp. 592-595. 1988 by T. Ema, S. Kawanago, T. Nishi, S. Yoshida. H. Nishibe, T. Yabu, Y. Kodama, T. Nakano and M. Taguchi.

"A Spread Stacked Capacitor (SCC) Cell for 64 Mbit DRAMS", IEDM, Dig. Tech. Papers, pp. 31-34, 1989, by S. Inoue, K. Hieda, A. Hitayama, F. Horiguchi and F. Masuoka.

Primary Examiner—Tom Thomas
Attorney, Agent, or Firm—David J. Paul

[57] ABSTRACT

A stacked surrounding reintrant wall capacitor (SSRWC) using a modified stacked capacitor storage cell fabrication process. The SSRWC is made up of polysilicon structure, having an elongated v-shaped cross-section, located at a buried contact and extending to an adjacent storage node overlaid by polysilicon with a dielectric sandwiched in between. The addition of the polysilicon structure increases storage capability 50% without enlarging the surface area defined for a normal stacked capacitor cell.

24 Claims, 6 Drawing Sheets

METHOD OF MAKING STACKED SURROUNDING REINTRANT WALL CAPACITOR

FIELD OF THE INVENTION

This invention relates to semiconductor circuit memory storage devices and more particularly to the design of three-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate charge in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continue to increase for future generations of memory devices.

The ability to densely pack storage cells while maintaining required storage capabilities is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two layers of a conductive material such as polycrystalline silicon (polysilicon or poly) are deposited over an access device on a silicon wafer with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining high dielectric breakdown characteristics between poly layers in the STC capacitor becomes a major concern once insulator thickness is appropriately scaled.

A paper submitted by T. Ema, S. Kawanago, T. Nishi, S. Yoshida, H. Nishibe, T. Yabu, Y. Kodama, T. Nakano and M. Taguchi, entitled "3—DIMENSIONAL STACKED CAPACITOR CELL FOR 16M AND 64M DRAMS," IEDM, Dig. Tech. Papers, pp. 592-595, 1988, herein incorporated by reference, discusses a 3—dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the polysilicon fins (used for a capacitor cell plate) covering the fins and filling in the gaps. This design can be fabricated using current methods and increases storage capacitance, but it is not suitable for a deep submicron (such as 0.2 micron) design rule DRAM cell because the total thickness of several fins making up the cell plate is much larger than minimum feature size. In addition, the process flow needed to realize this fin structure requires precise alignment between two adjacent word lines and digits lines. This alignment along with the requirement to have the storage node poly overlap the storage node contact leads to a larger cell area that is not suitable for 0.2 micron design rules mentioned previously.

Also, in a paper submitted by S. Inoue, K. Hieda, A. Nitayama, F. Horiguchi and F. Masuoka, entitled "A SPREAD STACKED CAPACITOR (SSC) CELL FOR 64MBIT DRAMS," IEDM, Dig. Tech. Papers, pp. 31-34, 1989, herein incorporated by reference, discusses a storage electrode of a 1st memory cell being expanded to the neighboring 2nd memory cell area.

The SSC cell fabrication process (refer to FIG. 2 pp. 32) begins with a storage electrode deposited above the digit lines that is expanded from the 1st memory cell to its adjacent memory cells and visa versa. This results in a stacked capacitor arrangement where each storage electrode can occupy two memory cell areas, thus almost doubling the storage capacitance of one memory cell.

However, the SSC process is complicated and adds at least two masks to the standard process and cannot be made with self-aligned contacts.

The present invention develops an existing stacked capacitor fabrication process to construct a three-dimensional stacked capacitor cell by using self aligned contacts while adding only one photolithography step.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional stacked surrounding reintrant wall capacitor (SSRWC) defined as a storage cell.

After a silicon wafer is prepared using conventional process steps, the present invention develops the SSRWC by creating a v-shaped poly structure with extended poly spacer walls, conforming to the topology formed by three adjacent word lines running perpendicular to two adjacent digit lines, which results in increased capacitor plate surface area for each storage cell. Such a structure has the potential to increase the capacitance of a conventional STC cell by 50% or more, depending on the wall height.

The invention will allow the maintenance of adjacent capacitance within a DRAM cell as geometries are dramatically shrunk.

DETAILED DESCRIPTION OF THE PREFERRED EMBODIMENT

The invention is directed to maximizing storage cell surface area in a high density/high volume DRAM fabrication process, in a sequence shown in FIGS. 1-9.

A silicon wafer is prepared using conventional process steps up to the point of defining a cell array. Capacitor fabrication will now follow.

The capacitor of each cell will make contact with a buried contact within the cell, while the capacitor will extend to the active area of an adjacent cell. Each active area within the array is isolated from one another by a thick field oxide and arranged in interdigitated columns and non-interdigitated rows. The active areas are used to form active MOS transistors that can be doped as NMOS or PMOS type FETs depending on the desired use.

Figure 1:
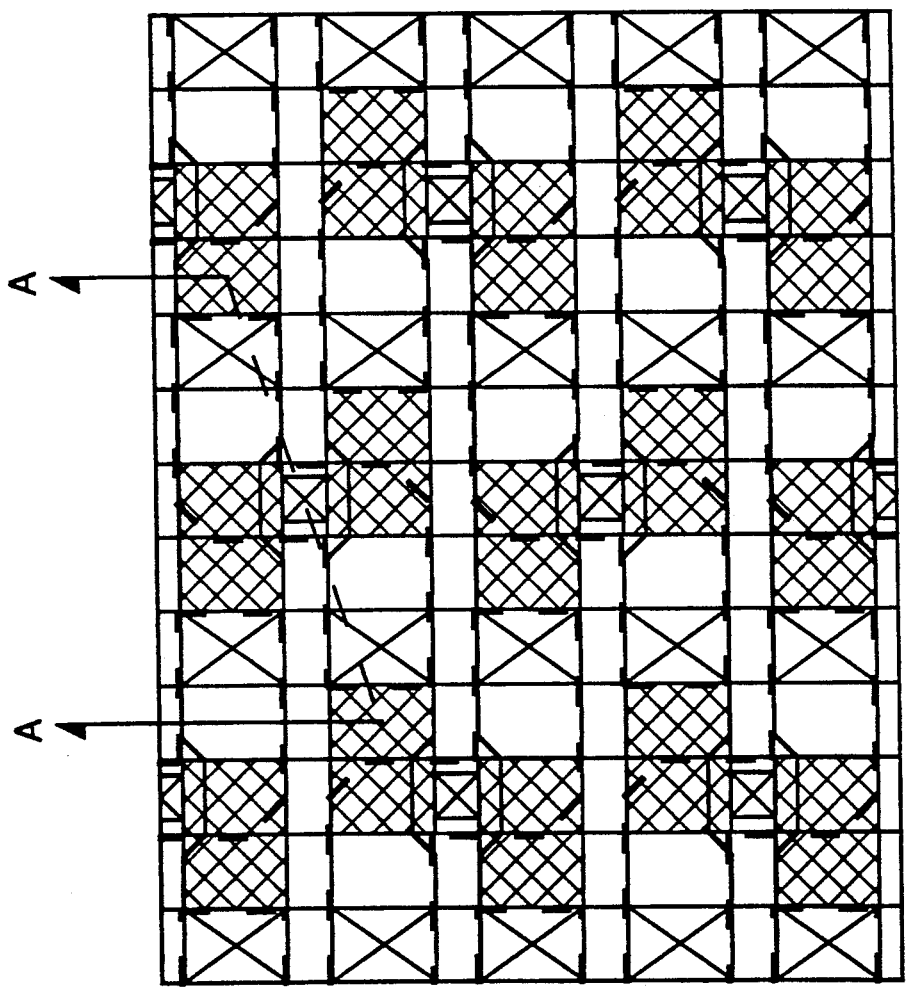
FIG. 1 is a top planar view of a portion of an in-process wafer showing digit lines, word lines, active areas and storage capacitors.

FIG. 1 shows a top planar view portion of a completed multilayered memory array with the main building blocks comprising digit lines 42, word lines 22, active area 21, and an SSRWC storage node plate 91. Active areas 21 have been implanted in such a manner as to have each adjacent active area interweave with one another in the row direction (defined by parallel word lines 22) thereby forming parallel interdigitated rows of active areas 21. In the column direction (defined by parallel digit lines 42) each adjacent active area 21 run end to end thereby forming parallel non-interdigitated columns of active areas 21. The stacked capacitor structure of the preferred embodiment (the SSRWC) is self-aligned to and over the top of word lines 42 as well as to digit lines 22.

Figure 2:
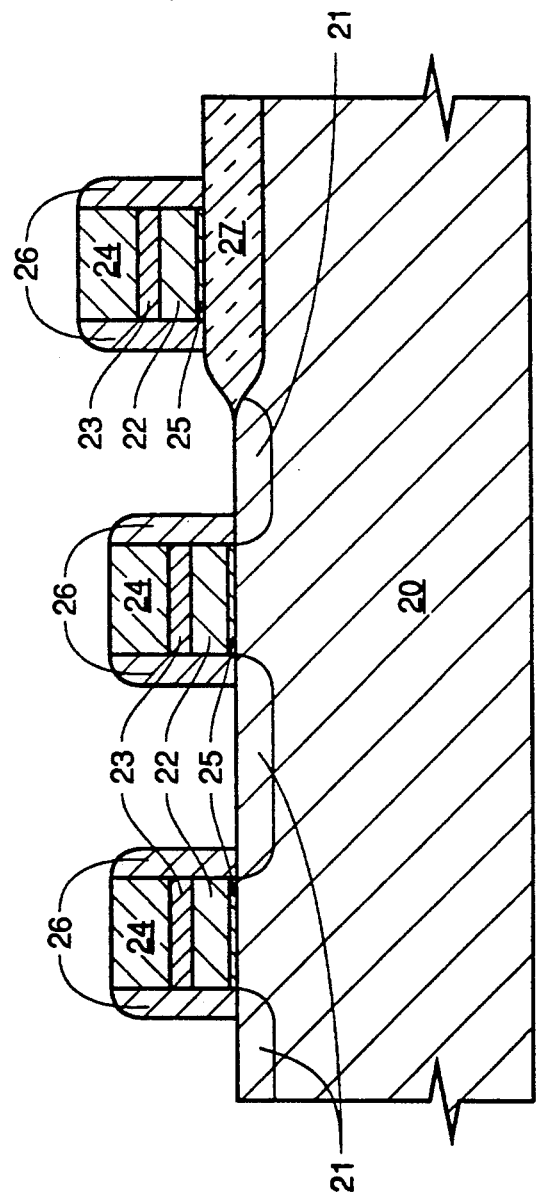
FIG. 2 is a cross-sectional view through broken line A—A of FIG. 1.

As shown in FIG. 2, parallel poly word lines 22, covered with silicide 23 and dielectric 24 (either oxide or nitride) and further isolated from subsequent conductive layers by dielectric spacers 26 (either oxide or nitride), have been previously deposited over a thin layer of gate oxide 25 or a thick layer of field oxide 27. Active areas 21 have been appropriately doped to a desired conductivity type which penetrates into the bulk silicon wafer 20, by conventional process steps. Now the wafer is ready for digit line formation that will run perpendicular to word lines 22.

Figure 3:
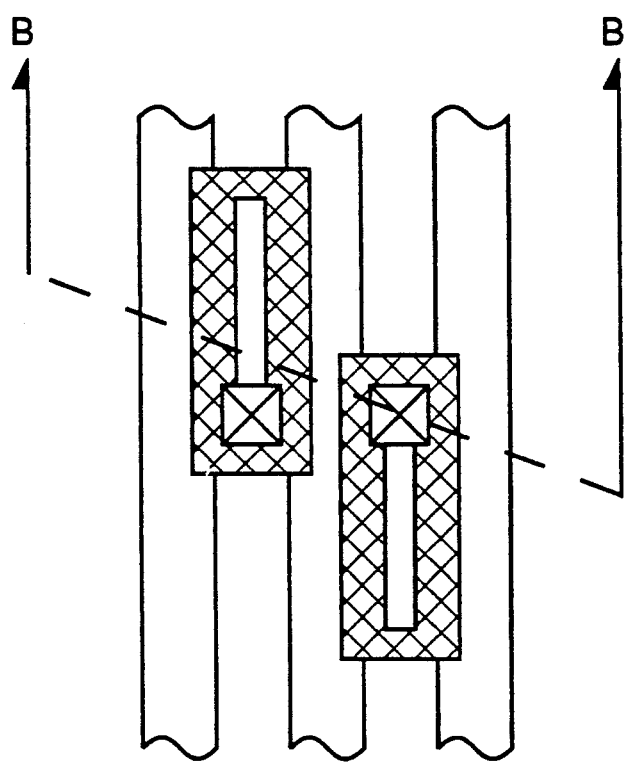
FIG. 3 is a top planar view of a portion of an in-process wafer showing digit lines, storage node contacts and storage capacitors.

FIG. 3 shows a top planar view of a portion of an in-process showing digit lines 42, storage node contacts 57, active areas 21 and storage capacitors 91.

Figure 4:
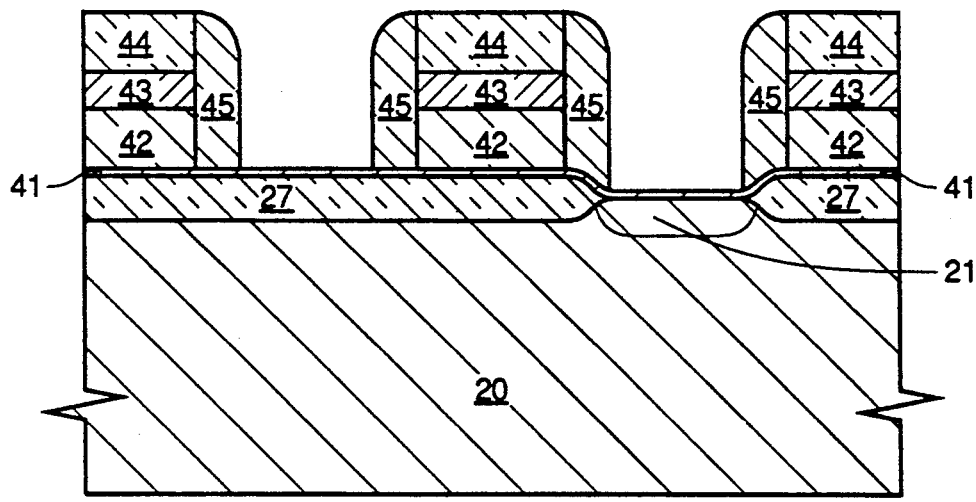
FIG. 4 is a cross-sectional view of the in-process wafer through broken line B—B of FIG. 3 following deposition and etching of vertical digit line dielectric spacers.

As shown in FIG. 4, an oxide layer 41 is deposited over the entire wafer array surface followed by buried digit line contacts patterning and etch. A blanket deposition of polysilicon 42, silicide 43 and dielectric 44, respectively. Dielectric 44 can be either nitride or oxide and is deposited by chemical vapor deposition (CVD) which is preferred for its excellent conformity. The layers of polysilicon 42, silicide 43 and dielectric 44 are patterned and etched with polysilicon 42, previously being conductively doped, in conjunction with silicide 43 to serve as parallel digit lines 42 covered with dielectric layer 44. Digit lines 42 run perpendicular to word lines 21 (shown in FIG. 2) and conform to the wafer surface resulting in a waveform-like topology running in both the digit line and word line directions.

Up to this point, process flow has followed that of an array comprising conventional stacked capacitor cells. From this point forward, the process is unique to an array having SSRWC-type storage capacitors. A second dielectric 45, such as nitride or oxide is now deposited, followed by an anisotropic etch to form dielectric spacers 45.

Figure 5:
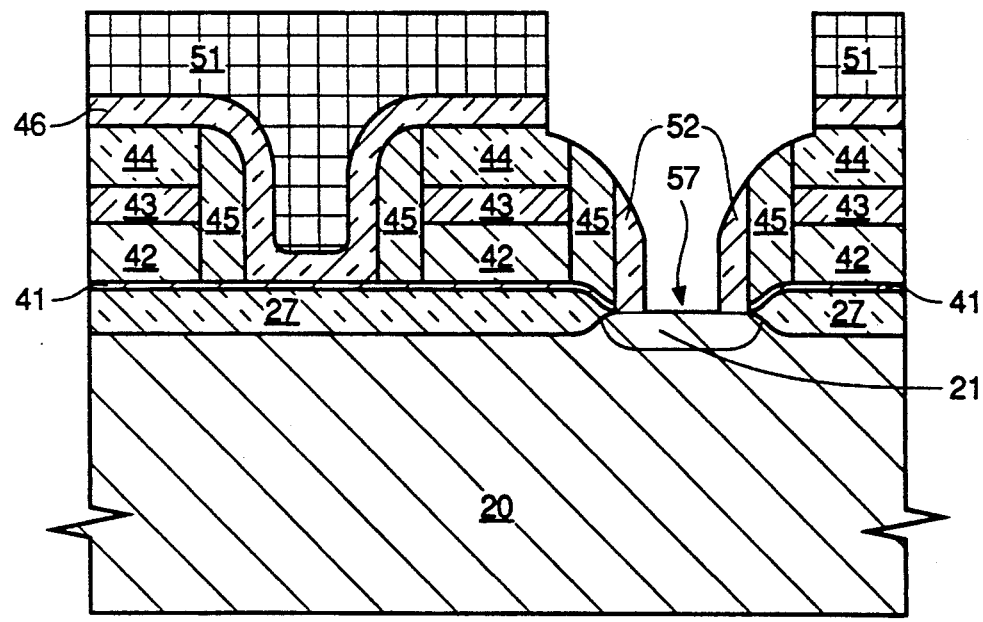
FIG. 5 is a cross-sectional view of the in-process wafer portion of FIG. 4 after conformal dielectric deposition, followed by a buried contact photo and etch.

As shown in FIG. 5, digit lines 42 and their subsequent isolation layers are then covered with a dielectric 46 that is also either oxide or nitride, to a preferred thickness of 500 to 2000 angstroms preferably by CVD. Subsequently, a buried contact 57, self-aligned to digit lines 42 by the presence of spacers 45, is located by covering all areas other than contact 57 with photoresist 51. After applying an appropriate photomask, a buried contact anisotropic etch on the exposed dielectric creates additional spacers 52 and provides an opening to locate contact 57.

Figure 6:
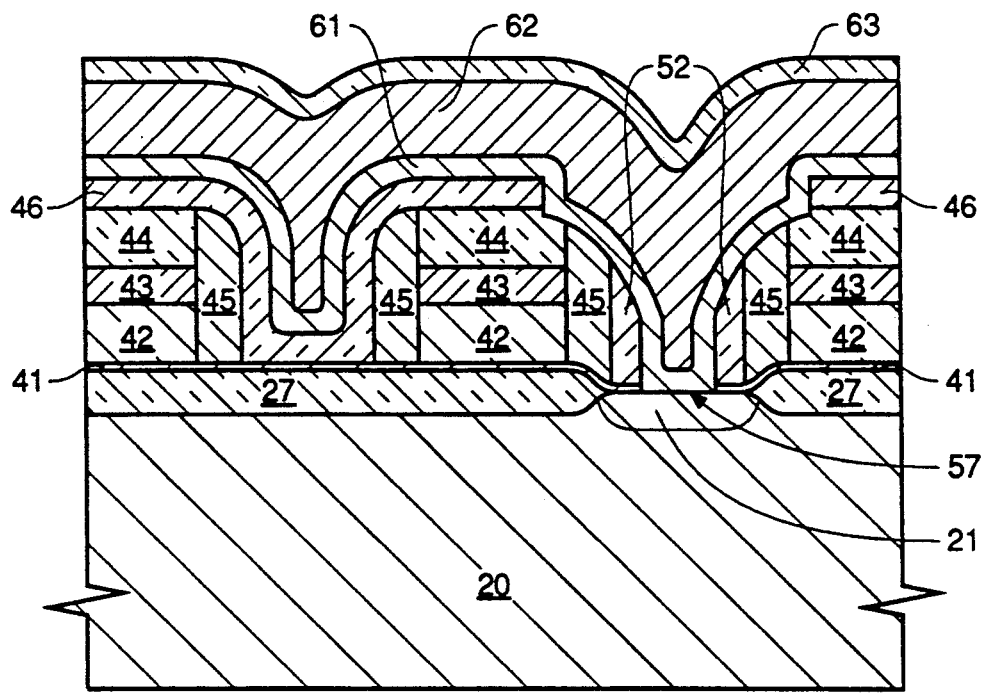
FIG. 6 is a cross-sectional view of the in-process wafer of portion of FIG. 5 following a photoresist strip, a blanket deposition of conformal poly, poly doping and blanket depositions of nitride and oxide, respectively.

As shown in FIG. 6, the photoresist has been stripped and a conformal poly layer 61 is deposited, preferably by low temperature deposition, over the entire array surface and couples to active area 21 via buried contact 57. Using low temperature deposition causes poly layer 61 to have a rugged textured surface that potentially doubles the surface area of poly layer 61. Following poly 61 deposition, conformal layers of nitride 62 and oxide 63, respectively, are preferably deposited by CVD.

Figure 7:
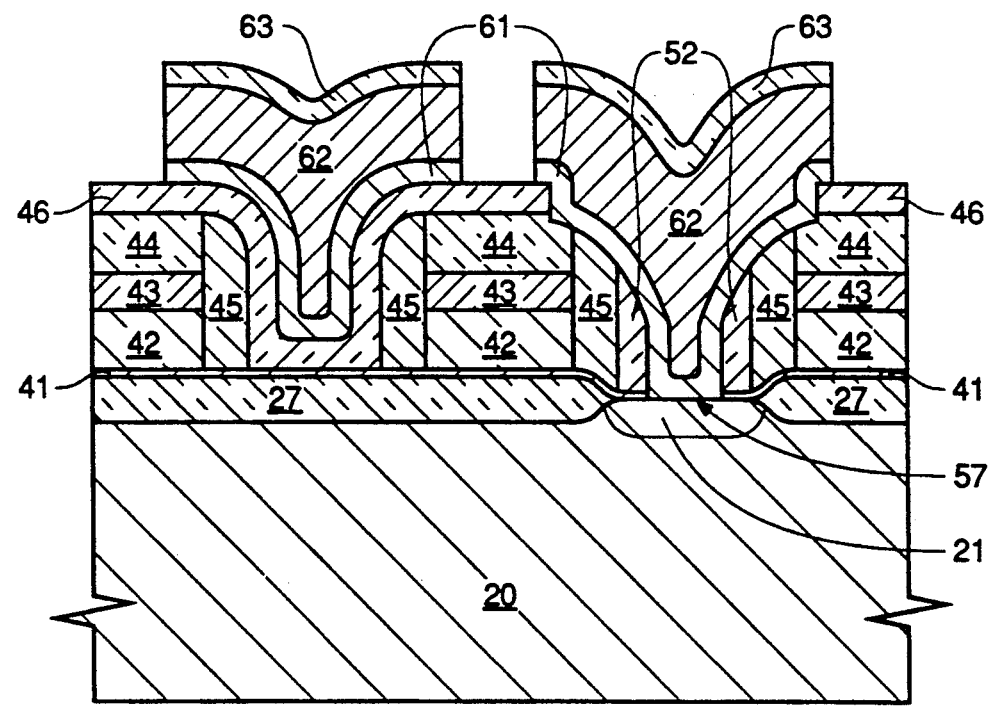
FIG. 7 is a cross-sectional view of the in-process wafer of portion of FIG. 6 following patterning of a poly storage node.

As shown in FIG. 7, poly layer 61, nitride 62 and oxide 63 are patterned to serve as a portion of a storage-node plate of the SSRWC storage capacitor. Poly plate 61 extends over an adjacent poly word line (the word line is not shown as it runs parallel to the cross-sectional view of FIG. 7) and continues to the next adjacent word line. Plate 61 conforms to the two perpendicular waveform-like topology (created after digit line formation) which run in both the word lines and the digit lines directions.

Figure 8:
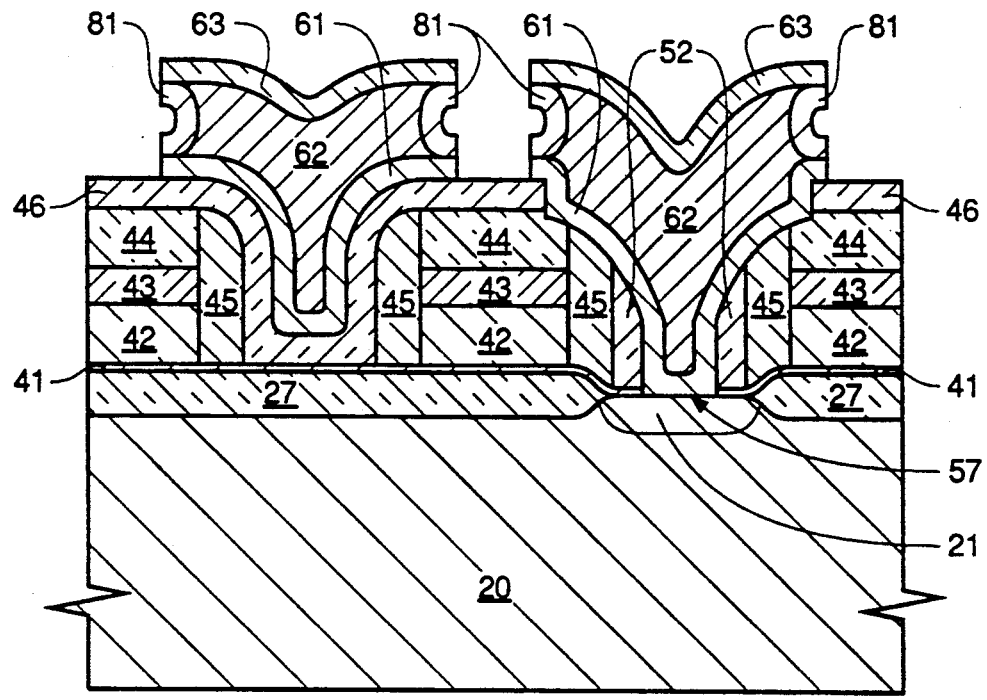
FIG. 8 is a cross-sectional view of the in-process wafer of portion of FIG. 7 after a controlled nitride etch followed by deposition and dry etching of conformal poly.

As shown in FIG. 8, a controlled nitride wet etch provides a cavity in nitride 62 to allow for a subsequent deposition of poly 81 that is then anisotropically etched to conform to the existing shape of plate 61. Due to the presence of oxide 63 a portion of poly 81 deposited in the cavity between oxide 63 and poly 61 is protected from the anisotropic poly etch thus extending poly plate 61 in a substantially vertical direction. In addition, both sides of the walls formed by the remaining poly 81 are available to gain capacitance. Following the etching of poly 81 oxide 63 and nitride 62 are removed by an isotropic oxide wet etch followed by an isotropic nitride wet etch leaving an elongated v-shaped poly structure 91, of FIG. 9, to serve as a completed storage-node plate for the SSRWC cell.

Figure 9:
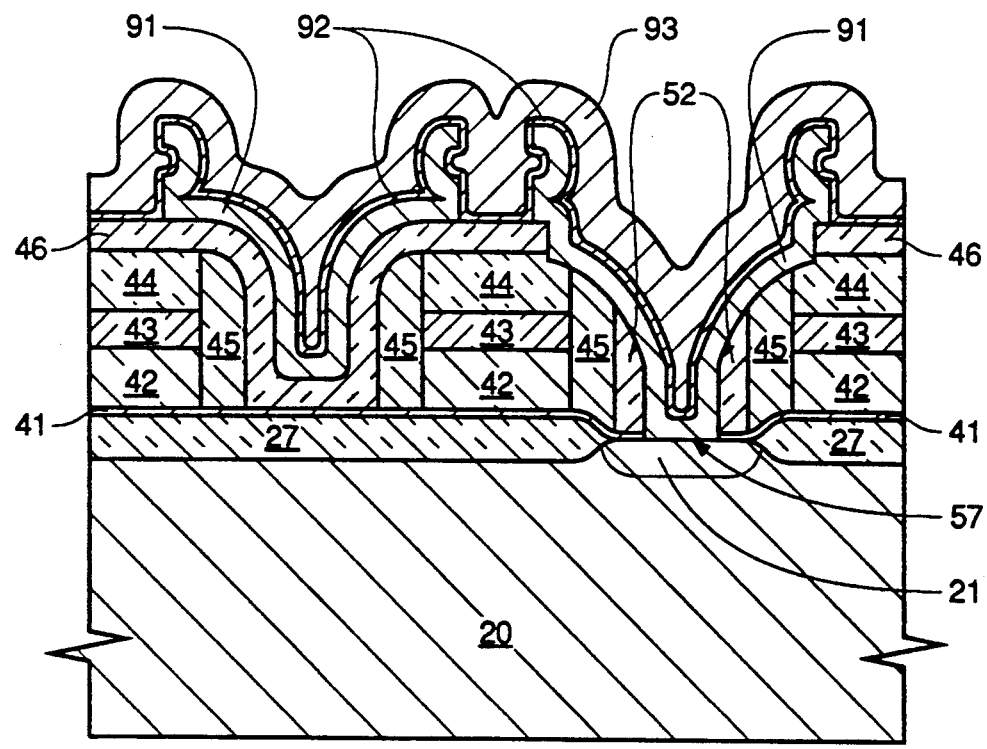
FIG. 9 is a cross-sectional view of the in-process wafer of portion of FIG. 8 following a wet oxide etch, a wet nitride etch, and blanket depositions of conformal nitride and poly.
Figure 1:
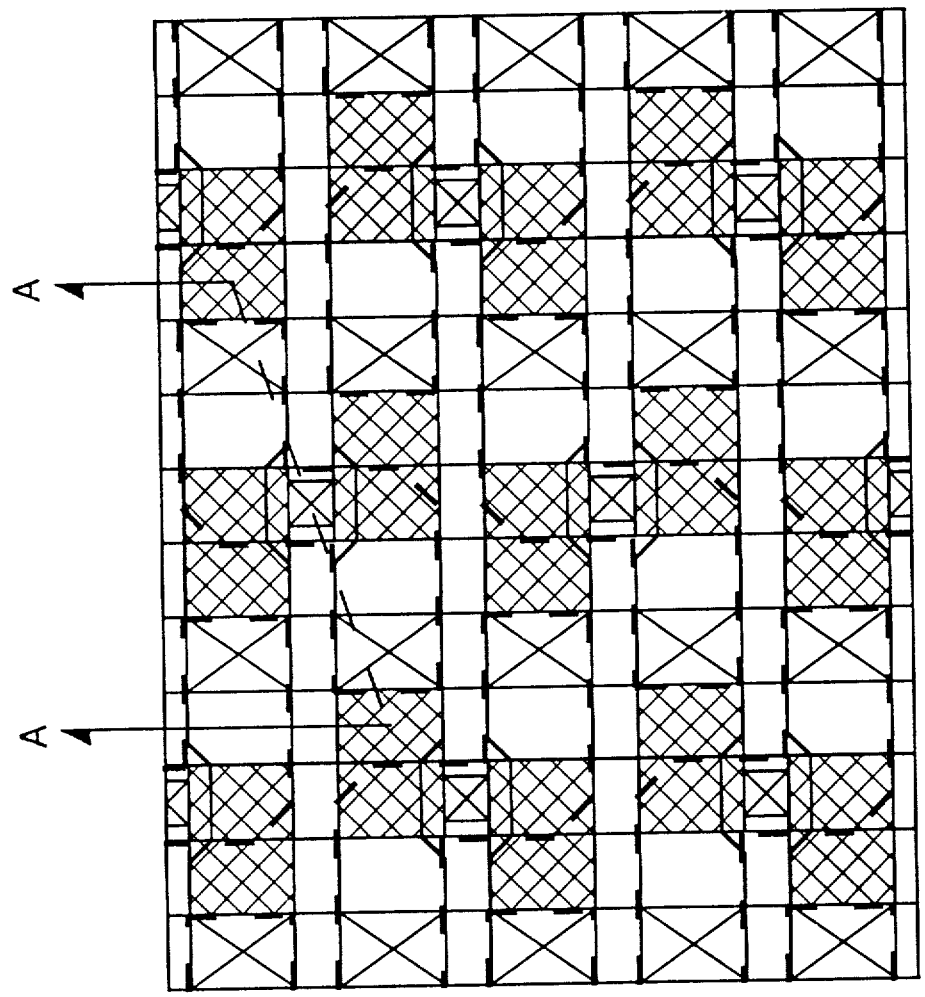
Figure 3:
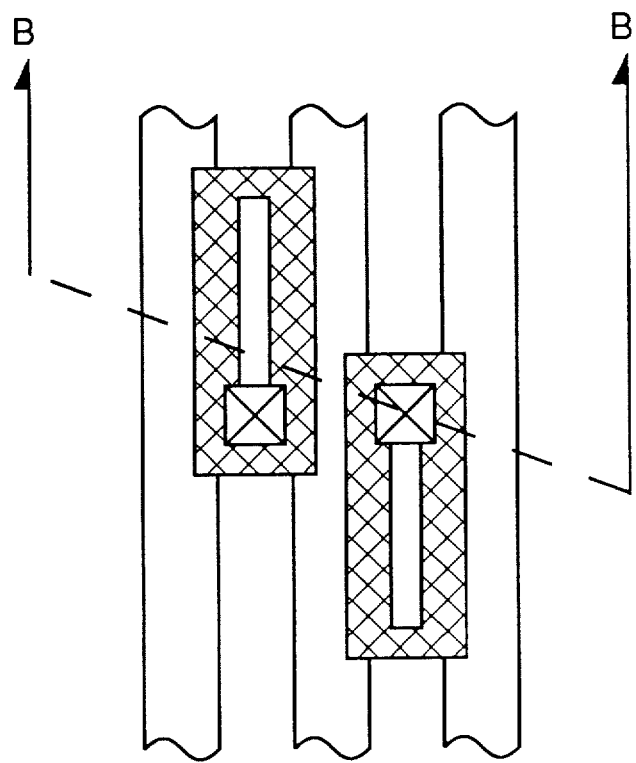

As is also shown in FIG. 9, a dielectric layer of nitride 92 is deposited that conforms to poly structure 91. Nitride 92 serves as a capacitor dielectric for the SSRWC cell. Following nitride 92 deposition, a blanket deposition of conformal poly 93 is deposited. Poly structure 91 and poly 93 are conductively doped either n-type or p-type depending on the conductivity type desired for active area 21. Poly 93 now serves as a top poly capacitor cell plate of the SSRWC storage capacitor which also becomes a common cell plate to all SSRWC storage capacitors in the array.

With the addition of poly plate 91 as the storage node plate along with top poly capacitor cell plate 93 that envelops plate 91, substantial capacitor plate surface area is gained at the storage node. Since capacitance is mainly effected by the surface area of a capacitor's cell plates the additional area gained by a 3-dimensional SSRWC structure can provide an additional 50% increase or more in capacitance over that of a conventional STC capacitor, without more space than that required for defining a stacked capacitor storage cell. In fact the capacitance gained depends directly on the wall height of the elongated v-shaped cell.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a DRAM array on a silicon substrate, said process comprising the following sequence of steps:

creating a plurality of separately isolated active areas arranged in parallel interdigitated rows and parallel non-interdigitated columns;

creating a gate dielectric layer on top of each active area;

depositing a first conductive layer superjacent surface of said silicon substrate;

depositing a first dielectric layer superjacent said first conductive layer;

masking and etching said first conductive and said first dielectric layers to form a plurality of parallel conductive word lines aligned along said rows such that each said word line passes over a inner portion of each said active area being separated therefrom by a remanent of said gate dielectric layer;

creating of a conductively-doped digit line junction and storage node junction within each said active are on opposite sides of each said word line;

depositing a second dielectric layer superjacent said array surface;

creating a first aligned buried contact location at each said digit line junction in each said active area;

depositing a second conductive layer superjacent said array surface, said second conductive layer making direct contact to said digit line junctions at said first buried contact locations;

depositing a third dielectric layer superjacent to said second conductive layer;

masking and etching said second conductive layer and said third dielectric layer to form a plurality of parallel conductive digit lines aligned along said columns such that a digit line makes electrical contact at each digit line junction within a column, said digit lines running perpendicular to and over said word lines forming a 3-dimensional, waveform-like topology;

depositing a first oxide layer superjacent said array surface of said waveform-like topology;

creating a second aligned buried contact location at each said storage node junction in each said active area;

depositing a third conductive layer superjacent said array surface assuming said waveform-like topology in response to existing topology, said third conductive layer making contact to said storage node junctions at said second buried contact locations;

depositing fourth and fifth dielectric layers;

patterning said third conductive layer and said fourth and fifth dielectric layers, to form a portion of a storage node plate at each said storage node junction, said storage node plate having a v-shaped cross-section;

isotropically etching said fourth dielectric layer thereby forming a cavity in each exposed edge of said patterned fourth dielectric layer;

depositing and patterning a fourth conductive layer, said fourth conductive layer attaching to said third conductive layer thereby forming a completed storage node plate having an elongated v-shaped cross-section;

isotropically etching said fourth and said fifth dielectric layers to expose said completed storage node;

depositing a cell dielectric layer adjacent and coextensive with said storage node plate and adjacent said array surface; and depositing a fourth conductive layer adjacent to and coextensive with said cell dielectric layer to form a cell plate common to the entire memory array.

2. A process as recited in claim 1, wherein said gate dielectric layer is oxide.

3. A process as recited in claim 1, wherein said first and said second conductive layers comprise a layer of tungsten silicide and doped polysilicon.

4. A process as recited in claim 1, wherein said first and said second dielectric layers are selected from the group consisting essentially of oxide or nitride.

5. A process as recited in claim 1, wherein said third and said fifth dielectric layers are oxide.

6. A process as recited in claim 1, wherein said fourth dielectric layer is nitride.

7. A process as recited in claim 1, wherein said first and said second buried contacts are self aligned.

8. A process as recited in claim 1, wherein said first oxide layer is TEOS.

9. A process as recited in claim 1, wherein said third, said fourth and said fifth conductive layers are doped polysilicon.

10. A process as recited in claim 9, wherein said third and said fourth conductive layers are deposited by low temperature deposition.

11. A process as recited in claim 1, wherein said second, said third, said fourth and said fifth dielectric layers are deposited by chemical vapor deposition.

12. A process as recited in claim 1, wherein said cell dielectric layer is nitride.

13. A process as recited in claim 5, wherein said etching of oxide is a wet oxide etch.

14. A process as recited in claim 6, wherein said etching of nitride is a wet nitride etch.

15. A process of fabricating a DRAM storage capacitor on a silicon substrate having active areas, word lines and digit lines, said process comprising the following sequence of steps:

depositing a first dielectric layer superjacent existing topology of surface of said silicon substrate;

creating an aligned buried contact opening thereby allowing access to said active area at the desired location by exposing a portion of said active area;

depositing a first conductive layer superjacent said first dielectric layer and said buried contact opening, said first conductive layer making contact to said exposed portion of the active area and thereby forming a storage node junction;

depositing second and third dielectric layers;

patterning said first conductive layer and said second and third dielectric layers to form a portion of a storage node plate at said storage node junction, said storage node plate having a v-shaped cross-section;

isotropically etching said second dielectric layer thereby forming a cavity in each exposed edge of said patterned second dielectric layer;

depositing and patterning a second conductive layer, said second conductive layer attaching to said patterned first conductive layer thereby forming a completed storage node plate having an elongated v-shaped cross-section;

isotropically etching said second and said third dielectric layers to expose said completed storage node;

depositing a cell dielectric layer adjacent and coextensive with said storage node plate; and depositing a third conductive layer adjacent and co-extensive said cell dielectric layer to form an upper cell plate.

16. A process as recited in claim 15, wherein said first and said third dielectric layers are oxide.

17. A process as recited in claim 15, wherein said second dielectric layer is nitride.

18. A process as recited in claim 15, wherein said buried contact is self aligned.

19. A process as recited in claim 15, wherein said first, said second and said third conductive layers are doped polysilicon.

20. A process as recited in claim 19, wherein said first and said second conductive layers are deposited by low temperature deposition.

21. A process as recited in claim 15, wherein said first, said second, and said third dielectric layers are deposited by chemical vapor deposition.

22. A process as recited in claim 15, wherein said cell dielectric layer is nitride.

23. A process as recited in claim 16, wherein said etching of oxide is a wet oxide etch.

24. A process as recited in claim 17, wherein said etching of nitride is a wet nitride etch.

* * * * *

UNITED STATES PATENT AND TRADEMARK OFFICE
CERTIFICATE OF CORRECTION

PATENT NO.   : 5,100,825
DATED        : March 31, 1992
INVENTOR(S)  : Pierre C. Fazan et al.

It is certified that error appears in the above-indentified patent and that said Letters Patent is hereby corrected as shown below:

The attached, Examiner approved, final formal drawing for Figure 1 replaces the drawing for Figure 1 as printed on sheet 1 of 6.

The attached, Exmainer approved, final formal drawing for Figure 3 replaces the drawing for Figure 3 as printed on sheet 3 of 6.

Signed and Sealed this

Twenty-ninth Day of June, 1993

Attest:

MICHAEL K. KIRK

Attesting Officer    Acting Commissioner of Patents and Trademarks